(12) United States Patent
Choi et al.

(10) Patent No.: US 7,955,957 B2
(45) Date of Patent: Jun. 7, 2011

(54) GROUP III-NITRIDE SEMICONDUCTOR THIN FILM, METHOD FOR FABRICATING THE SAME, AND GROUP III-NITRIDE SEMICONDUCTOR LIGHT EMITTING DEVICE

(75) Inventors: Rak Jun Choi, Tokushima (JP); Sakai Shiro, Tokushima (JP); Naoi Yoshiki, Tokushima (JP)

(73) Assignee: Samsung LED Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/612,206

(22) Filed: Nov. 4, 2009

(65) Prior Publication Data

US 2010/0055883 A1 Mar. 4, 2010

Related U.S. Application Data

(62) Division of application No. 11/512,380, filed on Aug. 30, 2006, now Pat. No. 7,687,814.

(30) Foreign Application Priority Data

Aug. 30, 2005 (JP) .................... 2005-250185

(51) Int. Cl.
*H01L 21/20* (2006.01)
*H01L 21/36* (2006.01)
*H01L 21/28* (2006.01)
*H01L 21/3205* (2006.01)

(52) U.S. Cl. .. 438/481; 438/604; 438/763; 257/E21.086

(58) Field of Classification Search .................... 438/47, 438/94, 481, 604, 763; 257/E21.086
See application file for complete search history.

(56) References Cited

U.S. PATENT DOCUMENTS

| | | | |
|---|---|---|---|
| 6,445,127 | B1 | 9/2002 | Oku et al. |
| 2007/0120141 | A1* | 5/2007 | Moustakas et al. ........... 257/103 |
| 2007/0241352 | A1* | 10/2007 | Yasuda et al. .................. 257/94 |
| 2008/0035908 | A1 | 2/2008 | Sakai |
| 2009/0045433 | A1 | 2/2009 | Osawa et al. |
| 2009/0078951 | A1 | 3/2009 | Miki et al. |
| 2009/0146162 | A1* | 6/2009 | Chakraborty et al. .......... 257/94 |

(Continued)

FOREIGN PATENT DOCUMENTS

EP 0 716 457 A2 6/1996

(Continued)

OTHER PUBLICATIONS

German Office Action issued in corresponding German Patent Application No. DE 10 2006 040 479.3-33, issued on Nov. 12, 2007.

(Continued)

*Primary Examiner* — Ngan Ngo
(74) *Attorney, Agent, or Firm* — McDermott Will & Emery LLP

(57) ABSTRACT

Disclosed herein is a high-quality group III-nitride semiconductor thin film and group III-nitride semiconductor light emitting device using the same. To obtain the group III-nitride semiconductor thin film, an AlInN buffer layer is formed on a (1-102)-plane (so called r-plane) sapphire substrate by use of a MOCVD apparatus under atmospheric pressure while controlling a temperature of the substrate within a range from 850 to 950 degrees Celsius, and then, GaN-based compound, such as GaN, AlGaN or the like, is epitaxially grown on the buffer layer at a high temperature. The group III-nitride semiconductor light emitting device is fabricated by using the group III-nitride semiconductor thin film as a base layer.

7 Claims, 12 Drawing Sheets

U.S. PATENT DOCUMENTS

2010/0102330 A1 * 4/2010 Motoki et al. .................. 257/76

FOREIGN PATENT DOCUMENTS

| EP | 0 905 799 | A2 | 3/1999 |
|---|---|---|---|
| EP | 1 014 455 | A1 | 6/2000 |
| JP | 11-112029 | | 4/1999 |
| JP | 2004-235473 | | 8/2004 |

OTHER PUBLICATIONS

Zhang, J. et al. "Pulsed atomic layer expitaxy of equaternary AllnGaN layers." Applied Physics Letters, ISSN 0003-6951, vol. 79, 2001, No. 7 S..925-927.

Japanese Office Action, w/ English translation thereof, issued in Japanese Patent Application No. JP 2005-250185 dated Nov. 2, 2010.

* cited by examiner

GROUP III-NITRIDE SEMICONDUCTOR THIN FILM, METHOD FOR FABRICATING THE SAME, AND GROUP III-NITRIDE SEMICONDUCTOR LIGHT EMITTING DEVICE

CROSS-REFERENCE TO RELATED APPLICATIONS

This application is a Divisional of U.S. application Ser. No. 11/512,380, filed on Aug. 30, 2006, now U.S. Pat. No. 7,687,814, claiming priority of Japanese Patent Application No. 2005-250185, filed on Aug. 30, 2005, the entire contents of each of which are hereby incorporated by reference.

CLAIM OF PRIORITY

The present application is based on, and claims priority from, JP Application 2005-00250185, filed Aug. 30, 2005, the disclosure of which is incorporated by reference herein in its entirety.

BACKGROUND OF THE INVENTION

1. Field of the Invention

The present invention relates to a group III-nitride semiconductor thin film, a method for fabricating the same, and a group III-nitride semiconductor light emitting device, and more particularly, to a thin film which can serve as a base layer for the epitaxial growth of GaN-based compounds thereon.

2. Description of the Related Art

Group III-nitride semiconductors, more particularly, GaN-based compounds, have an ability of widely controlling an energy gap by regulation of a composition ratio thereof. As an example, GaN-based compounds, which have the formula $Al_xIn_yGa_{(1-x-y)}N$ (where $0 \leq x \leq 1$, $0 \leq y \leq 1$, $x=y=0$), act as a direct transition semiconductor, and have an energy gap in a range from 0.7-0.8 eV to 6.2 eV. Accordingly, it can be understood that utilizing GaN-based compounds in the formation of an active layer makes it possible to realize a light emitting device capable of emitting light of all colors in a visible range from red-color light to ultraviolet light.

To apply GaN-based compounds to a light emitting device, there is a necessity of a thin film having a high quality and high luminous efficiency in the viewpoint of the shape or lifespan of products. As known, GaN-based compounds have a hexagonal-wurtzite structure and the low lattice constant of GaN-based compounds shows a great difference with other main semiconductors (group III-V compound semiconductor, group II-VI semiconductor, etc.). The very low lattice constant is difficult to match to the lattice constant of a substrate crystal. Generally, if the lattice constant of a substrate crystal differs from the lattice constant of a crystal to be epitaxially grown on the substrate crystal, the resulting growth layer is easily affected by a compressive bending or tensile bending and tends to disadvantageously accumulate an elastic bending energy therein. Although the elastic energy is within an allowable range if the growth layer is thin, it may generate an electric potential if the thickness of the growth layer exceeds a certain value, thus causing lattice relaxation and resulting in a great amount of electric potential defects in the growth layer. For this reason, selection of a substrate is important in the growth of GaN-based compounds.

Conventionally, a c-plane sapphire substrate has been used as a substrate for growing GaN-based compounds thereon because it has a lattice constant most close to that of GaN. However, the lattice constant of the c-plane sapphire substrate still has a difference up to approximately 15% with that of GaN. Therefore, in order to alleviate the effect of lattice mismatch, a buffer layer has been actually formed between the sapphire substrate and a growth layer. Nowadays, the quality of the buffer layer becomes an important factor of determining the quality of a growth layer on the buffer layer. A variety of buffer layers have been proposed as a result of continuous research and development (Ref. Japanese Patent Publication Nos. Heisei 10-242586 and 9-227298).

SUMMARY OF THE INVENTION

Although a (0001)-plane (so-called c-plane) has been commonly used as a plane of a sapphire substrate, there may be a limit to improve the quality of a layer-growth base by use of combinations of the c-plane and a variety of buffer layers.

Moreover, in the case where a c-plane sapphire is used as a crystallization substrate, a GaN-based compound layer (hereinafter, referred to as a GaN-based growth layer) is grown on the substrate in a c-axis direction and represents remarkable c-axis characteristics in a thickness direction thereof. It is known that GaN-based compounds have a strong polarization property (piezoelectricity) in the c-axis direction. When the GaN-based growth layer is used as an active layer, however, the polarization property of Gan-based compounds causes carriers to be concentrated on uppermost and lowermost surfaces of the GaN-based growth layer, resulting in deterioration in the injection efficiency of carriers. Therefore, it is necessary to make the active layer sufficiently thin in order to reduce the effect of polarization. Such a requirement of a sufficiently thin active layer, in other words, a requirement of a technique for forming an active layer with a high accuracy, however, results in several disadvantages, such as deterioration in the yield of products and high-cost fabrication equipment.

Therefore, the present invention has been made in view of the above problems, and it is an object of the present invention to accomplish an outstanding development in the formation of a GaN-based growth layer not depending on the use of a c-plane sapphire substrate, thereby achieving an improvement in the quality of the GaN-based growth layer.

In accordance with a first aspect of the present invention, the above and other objects can be accomplished by the provision of a group III-nitride semiconductor thin film comprising: a (1-102)-plane sapphire substrate; a buffer layer located on the sapphire substrate and made of AlInN; and an epitaxial growth layer located on the buffer layer and made of group III-nitride.

In accordance with a second aspect of the present invention, the above and other objects can be accomplished by the provision of a group III-nitride semiconductor thin film comprising: a (1-102)-plane sapphire substrate; a buffer layer located on the sapphire substrate and made of group III-nitride; an intermediate layer located on the buffer layer and formed by stacking two or more multi-level layers one above another, each multi-level layer including a first metal layer and a second nitrogen layer; and an epitaxial growth layer located on the intermediate layer and made of group III-nitride.

In accordance with a third aspect of the present invention, the above and other objects can be accomplished by the provision of a group III-nitride semiconductor thin film comprising: a (1-102)-plane sapphire substrate; an intermediate layer located on the sapphire substrate and formed by stacking two or more multi-level layers one above another, each multi-level layer including a first metal layer and a second nitrogen layer; and an epitaxial growth layer located on the intermediate layer and made of group III-nitride.

In accordance with a fourth aspect of the present invention, the above and other objects can be accomplished by the provision of a group III-nitride semiconductor light emitting device including any one of the group III-nitride semiconductor thin films according to the first to third aspects of the present invention.

In accordance with a fifth aspect of the present invention, the above and other objects can be accomplished by the provision of a method for fabricating a group III-nitride semiconductor thin film comprising: forming a buffer layer, which is made of AlInN, on a (1-102)-plane sapphire substrate while controlling a temperature of the sapphire substrate in a range from 850 degrees Celsius to 950 degrees Celsius; and epitaxially growing group III-nitride on the buffer layer while controlling the sapphire substrate to a temperature higher than the temperature of the sapphire substrate controlled during the formation of the buffer layer.

In accordance with a sixth aspect of the present invention, the above and other objects can be accomplished by the provision of a method for fabricating a group III-nitride semiconductor thin film comprising: forming a buffer layer, which is made of group III-nitride, on a (1-102)-plane sapphire substrate while controlling the sapphire substrate to a first temperature; forming an intermediate layer on the buffer layer, the intermediate layer including two or more multi-level layers obtained by repeatedly forming the multi-level layer including a first metal layer and a second nitrogen layer; and epitaxially growing group III-nitride on the intermediate layer while controlling the sapphire substrate to a second temperature higher than the first temperature.

In accordance with a seventh aspect of the present invention, the above and other objects can be accomplished by the provision of a method for fabricating a group III-nitride semiconductor thin film comprising: forming an intermediate layer on a (1-102)-plane sapphire substrate, the intermediate layer including two or more multi-level layers obtained by repeatedly forming the multi-level layer including a first metal layer and a second nitrogen layer; and epitaxially growing group III-nitride on the intermediate layer.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, a group III-nitride semiconductor thin film, a method for fabricating the same, and a group III-nitride semiconductor light emitting device according to the present invention will be explained in detail with reference to the accompanying drawings. It is noted that the accompanying drawings are schematically shown, and the relationship of a thickness and width at each part, size ratio of different parts, etc. differ from actual values, and the same parts throughout the accompanying drawings may be shown in different sizes or ratios from each other if necessary.

First Embodiment

Now, a group III-nitride semiconductor thin film and a method for fabricating the same according to a first embodiment of the present invention will be explained. Briefly, the group III-nitride semiconductor thin film of the first embodiment includes a (1-102)-plane (so called r-plane) sapphire substrate, an AlInN buffer layer formed on the substrate, and a group III-nitride growth layer formed on the buffer layer.

Here, "−1" of the term (1-102) represents "1" added with a bar. Herein, a mirror index is represented in the same manner as the above. In the following description related to the first embodiment, a GaN layer is selected as an example of the group III-nitride growth layer.

Figure 1:
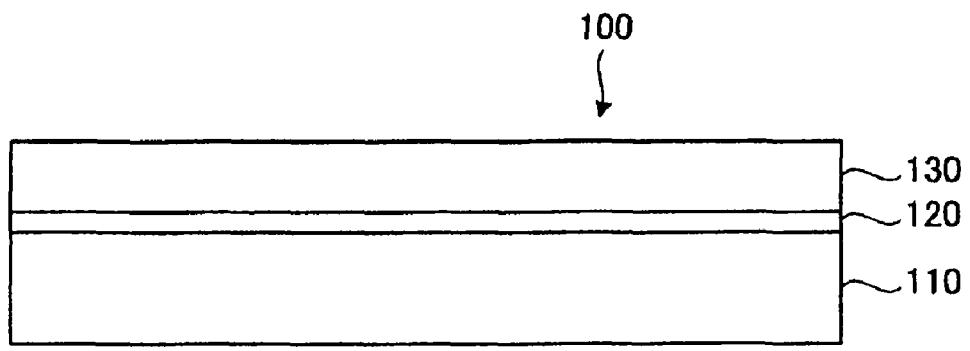
FIG. 1 is a schematic side sectional view illustrating a group III-nitride semiconductor thin film according to a first embodiment of the present invention.

FIG. 1 is a schematic side sectional view illustrating the group III-nitride semiconductor thin film according to the first embodiment of the present invention. In FIG. 1, the group III-nitride semiconductor thin film, which is designated as reference numeral 100, includes an r-plane sapphire substrate 110, an AlInN buffer layer 120 formed on the sapphire substrate 110, and an undoped GaN layer 130 formed on the AlInN buffer layer 120.

Figure 2:
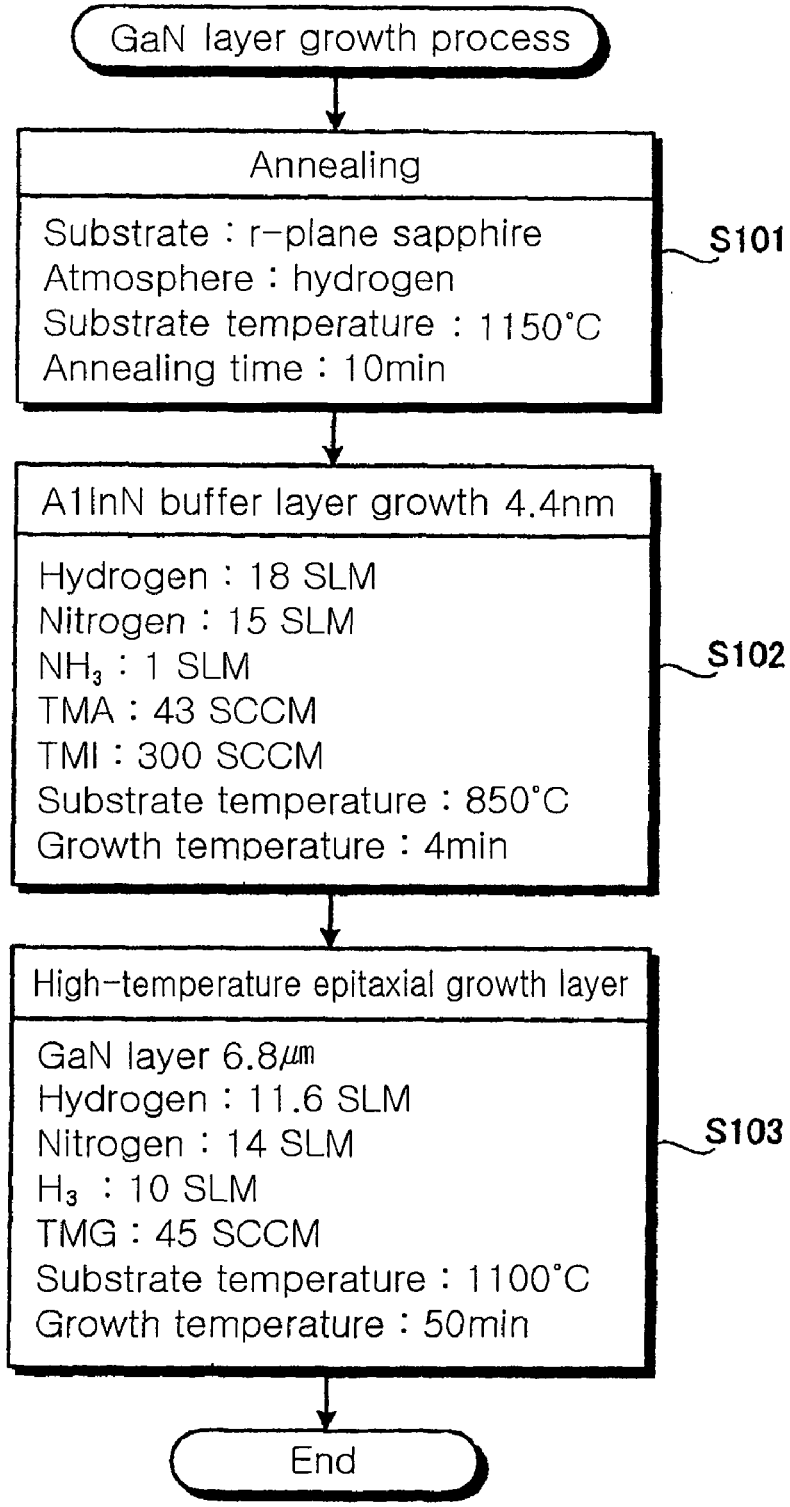
FIG. 2 is a flow chart illustrating a process for forming the group III-nitride semiconductor thin film according to the first embodiment of the present invention.

The group III-nitride semiconductor thin film 100 was obtained by the following fabrication method, which was developed by inventors of the present invention. FIG. 2 is a flow chart illustrating the fabrication method, more particularly, a process for forming a GaN growth layer. After the r-plane sapphire substrate 110, which is a single crystal substrate, was prepared and washed by use of a proper solution, the washed r-plane sapphire substrate 110 was introduced into a reaction chamber of a metal organic chemical vapor deposition (MOCVD) apparatus. As an initial process within the reaction chamber, an annealing process was performed on the sapphire substrate 110 for approximately 10 minutes under the atmosphere of an appropriate flow rate of hydrogen while the temperature of the substrate 110 is controlled to 1150 degrees Celsius (Step S101).

Subsequently, to grow the AlInN buffer layer 120 on the r-plane sapphire substrate 110, hydrogen and nitrogen, which serve as carrier gas, were introduced into the reaction chamber at the flow rates of 18 standard liters per minute (SLM) and 15 SLM, respectively, and ammonia ($NH_3$), trimethylaluminum (TMA) and trimethylindium (TMI), which serve as raw material gas, were introduced at the flow rates of 1 SLM, 43 standard cubic centimeter per minute (SCCM) and 300 SCCM, respectively. In this case, the temperature of the substrate was controlled to 850 degrees Celsius, and the growth time was 4 minutes. Thereby, the AlInN buffer layer having a thickness of approximately 4.4 nm was obtained (Step S102). In particular, the AlInN buffer layer 120 was grown under atmospheric pressure.

Thereafter, to grow a high-temperature epilayer, namely, undoped GaN layer, on the AlInN buffer layer 120, hydrogen and nitrogen, which serve as carrier gas, were introduced into the reaction chamber at the flow rates of 11.6 SLM and 14 SLM, respectively, and ammonia ($NH_3$) and trimethylgallium (TMG), which serve as raw material gas, were introduced at the flow rates of 10 SLM and 45 SCCM, respectively. In this case, the temperature of the substrate was controlled to 1100 degrees Celsius, and the growth time was 50 minutes. Thereby, the GaN layer having a thickness of approximately 6.8 μm was obtained (Step S103). Similarly, the GaN layer 130 was grown under atmospheric pressure.

Figure 3B:
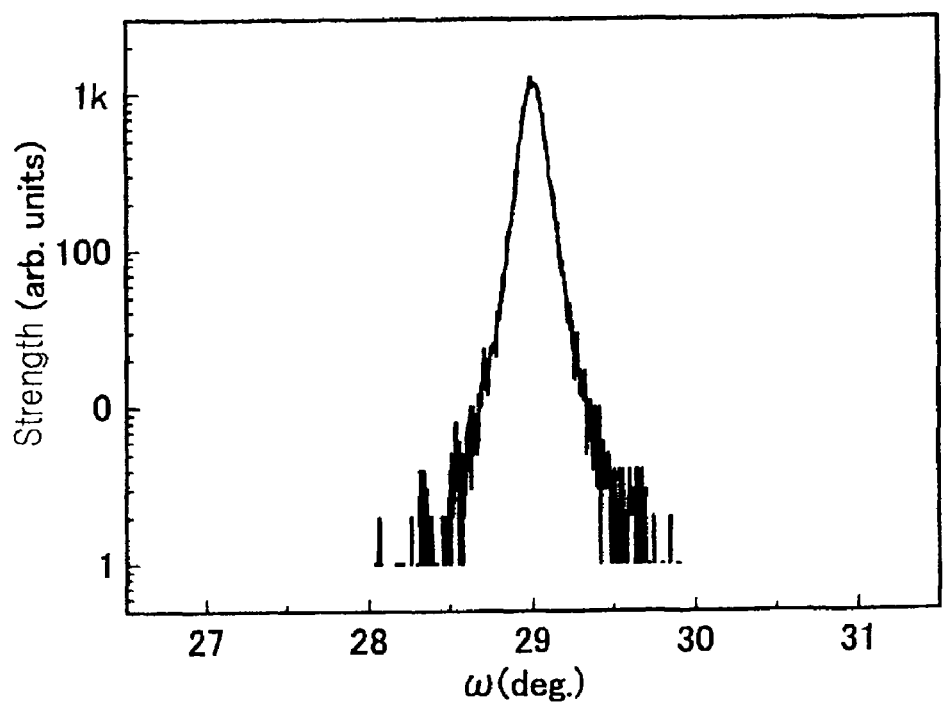
FIG. 3B is a graph illustrating X-ray diffraction evaluation data of the GaN layer obtained based on layer growth conditions shown in FIG. 2.
Figure 3A:
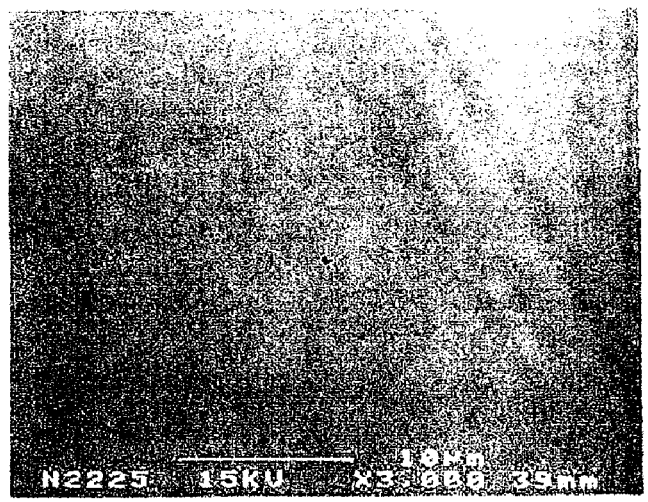
FIG. 3A is a scanning electron microscope (SEM) photograph illustrating a surface of a GaN layer obtained based on layer growth conditions shown in FIG. 2.

FIG. 3A is a scanning electron microscope (SEM) photograph illustrating a surface of the GaN layer 130 obtained by the above described layer growth conditions. Differently from a conventional GaN layer in which electric potential defects are observed as triangular morphologies, no visible morphology could be confirmed from the SEM photograph of FIG. 3A.

FIG. 3B is a graph illustrating X-ray diffraction evaluation data of the GaN layer 130 obtained by the above described layer growth conditions. As shown in FIG. 3B, the GaN layer 130 has a low full width at half maximum (FWHM) of approximately 518 arcsec. From this point, it can be understood that the GaN layer 130 has a gentle crystal axis slope relative to the sapphire substrate 110. Moreover, it could be understood that the GaN layer 130 was grown on the r-plane sapphire substrate 110 along an a-axis thereof. In other words, a c-axis of the GaN layer 130 is parallel to the substrate and is not affected by piezoelectricity in a thickness direction thereof.

Figure 4:
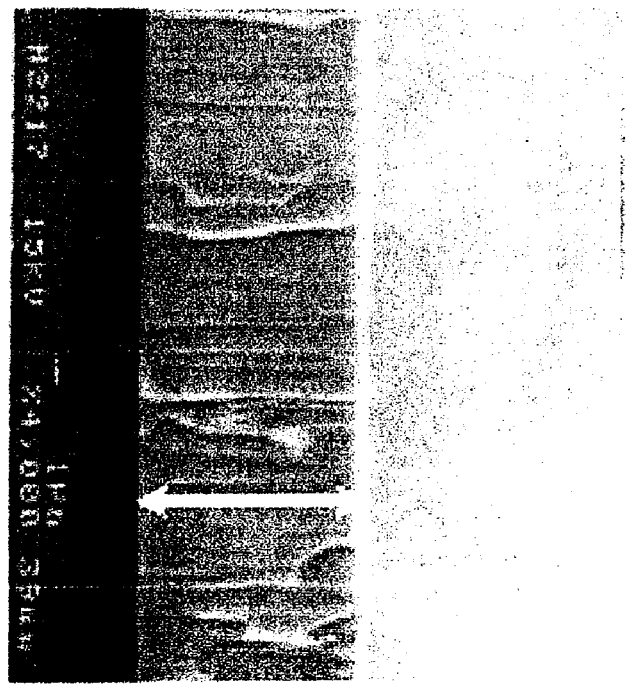
FIG. 4 is a transmission electron microscope (TEM) photograph illustrating the cross section of the group III-nitride semiconductor thin film obtained based on layer growth conditions shown in FIG. 2.

FIG. 4 is a transmission electron microscope (TEM) photograph illustrating the cross section of the group III-nitride semiconductor thin film 100 obtained by the above described layer growth conditions. As could be understood from the TEM photograph, the thickness of the grown GaN layer 130 has a thickness of approximately 6.8 μm.

Figure 5:
FIG. 5 is a SEM photograph illustrating a surface of an undoped GaN layer, which is grown on a GaN buffer layer, which is, in turn, grown on an r-plane sapphire substrate.

FIG. 5 is a SEM photograph illustrating a surface of the undoped GaN layer, which is grown on a GaN buffer layer when the GaN buffer layer is grown on the r-plane sapphire substrate 110 instead of the AlInN buffer layer 120. After completion of an annealing process based on conditions represented in the step S101 of FIG. 2, the temperature of the substrate was controlled within a range from 480 degrees Celsius to 700 degrees Celsius, and the growth time was regulated to 7.3 minutes, so as to obtain a layer thickness of 23 nm. The SEM photograph of FIG. 5 illustrates the best result when using the GaN buffer layer obtainable by the above described layer growth conditions. The growth conditions of the GaN buffer layer were determined with reference to growth conditions when a low-temperature GaN buffer layer is grown on a c-plane sapphire substrate.

Figure 6:
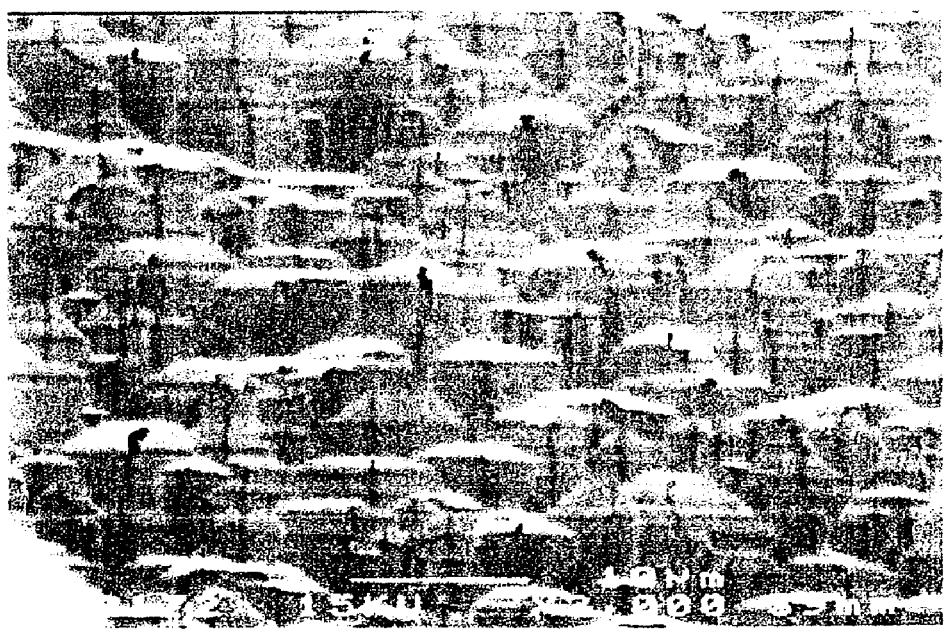
FIG. 6 is a SEM photograph illustrating a surface of an undoped GaN layer grown on an AlN buffer layer, which is, in turn, grown on an r-plane sapphire substrate.

FIG. 6 is a SEM photograph illustrating a surface of the undoped GaN layer, which is grown on an AlN buffer layer when the AlN buffer layer is grown on the r-plane sapphire substrate 110 instead of the AlInN buffer layer 120. After completion of an annealing process based on conditions represented in the step S101 of FIG. 2, the temperature of the substrate was controlled within a range from 850 degrees Celsius to 1050 degrees Celsius, and the growth time was regulated within a range from 30 seconds to 10 minutes. The SEM photograph of FIG. 6 illustrates the best result when using the AlN buffer layer on the condition that the growth time was regulated to 4 minutes (the thickness of the layer is in a range from 4 nm to 10 nm). The growth conditions of the AlN buffer layer were determined with reference to growth conditions when a low-temperature AlN buffer layer is grown on a c-plane sapphire substrate.

It could be confirmed from the SEM photographs of FIGS. 5 and 6 that, when any one of the GaN buffer layer and AlN buffer layer is grown on the r-plane sapphire substrate 110 and in turn, the undoped GaN layer is grown on the buffer layer, the surface of the undoped GaN layer has a number of triangular morphologies representing electric potential defects. In conclusion, in the case where the GaN buffer layer or AlN buffer layer is used as a buffer layer on the r-plane sapphire substrate 110, the surface of the GaN layer grown on the buffer layer has a low quality. Accordingly, as can be understood from the above result, it is desirable to interpose the AlInN buffer layer 120 between the r-plane sapphire substrate 110 and a growth layer thereon, in order to achieve a high-quality and high-temperature epilayer.

Although several kinds of group III-nitride semiconductor thin films 100, which include the r-plane sapphire substrate 110, AlInN buffer layer 120 and GaN layer 130, were obtained by changing the temperature of the substrate within a range from 700 degrees Celsius to 1100 degrees Celsius on the basis of growth conditions of the AlInN buffer layer 120, the best result was obtained when the temperature of the substrate was controlled within a range from 850 degrees Celsius to 950 degrees Celsius. Also, it could be seen that the thickness of the AlInN buffer layer 120 is preferably in a range from 1 nm to 100 nm, and more preferably, in a range from 1 nm to 20 nm.

As stated above, according to the first embodiment of the present invention, by forming an AlInN buffer layer on an r-plane sapphire substrate, a high-quality GaN layer can be grown thereon. In particular, the GaN layer is grown along an a-axis on the r-plane oriented sapphire substrate, and therefore, has no polarization in a thickness direction thereof, which is disadvantageously caused when using a c-plane sapphire substrate. This has the effect of avoiding generation of polarization in a GaN-based active layer when the GaN-based active layer is grown on a top surface of the GaN layer, and consequently, has the effect of enabling an increase in the thickness of the active layer. Such an increase in the thickness of the active layer makes it possible to increase the formation accuracy of the active layer. That is, the yield of products can be improved, and high-quality GaN-based semiconductor devices can be fabricated by use of low-price equipment, which does not require high-accuracy control.

Second Embodiment

Now, a group III-nitride semiconductor thin film and a method for fabricating the same according to a second embodiment of the present invention will be explained. Although the group III-nitride semiconductor thin film of the second embodiment is equal to that of the previously described first embodiment in the viewpoint that a group III-nitride growth layer (high-temperature epilayer) is formed on an r-plane sapphire substrate, there is a difference in the structure of a layer interposed between the sapphire substrate and the high-temperature epilayer. In the following description related to the second embodiment, similarly, a GaN layer is selected as an example of the group III-nitride growth layer.

Figure 7:
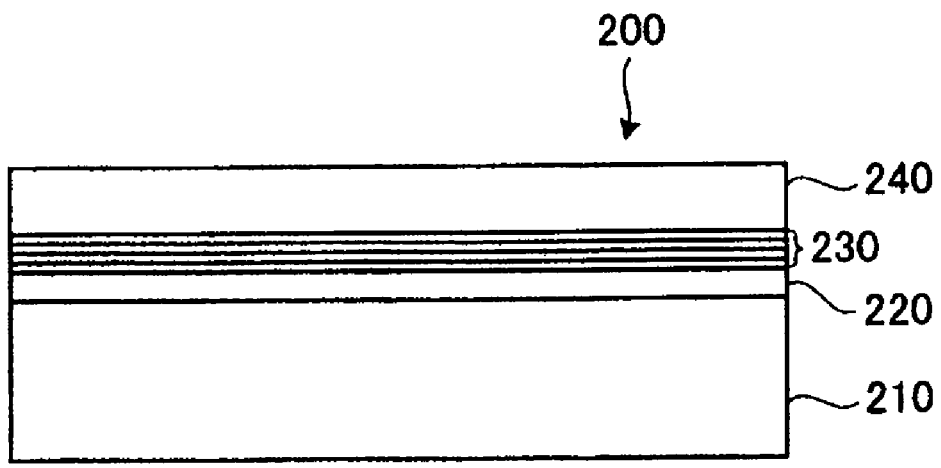
FIG. 7 is a schematic side sectional view illustrating a group III-nitride semiconductor thin film according to a second embodiment of the present invention.

FIG. 7 is a schematic side sectional view illustrating the group III-nitride semiconductor thin film according to the second embodiment of the present invention. In FIG. 7, the group III-nitride semiconductor thin film of the second embodiment, which is designated as reference numeral 200, includes an r-plane sapphire substrate 210, a low-temperature buffer layer 220 formed on the sapphire substrate 210, an intermediate layer 230 formed on the low-temperature buffer layer 220, and an undoped GaN layer 240 formed on the intermediate layer 230.

Figure 8:
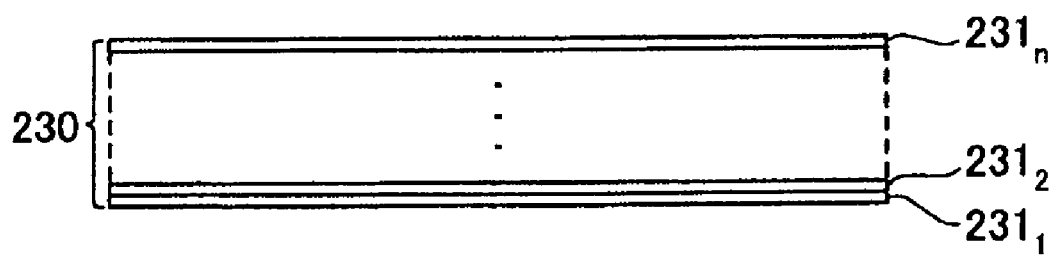
FIG. 8 is a schematic side sectional view illustrating an intermediate layer of the group III-nitride semiconductor thin film according to the second embodiment of the present invention.

The group III-nitride semiconductor thin film 200 of the second embodiment, in particular, is characterized in the structure of the intermediate layer 230 and its fabrication method. FIG. 8 is a schematic side sectional view of the intermediate layer 230. As shown in FIG. 8, the intermediate layer 230 is a multilayer obtained by stacking a plurality of layers $231_1$ to $231_n$, which have the same composition as one another. Also, each of the layers $231_1$ to $231_n$ is formed by sequentially stacking several different materials. For example, each of the layers $231_1$ to $231_n$ may be formed by sequentially stacking Ga, N and GaN, so as to form a so-called Ga/N/GaN layer, or may be formed by sequentially stacking Al, In, Ga and N, so as to form a so-called Al/In/Ga/N layer.

Figure 9:
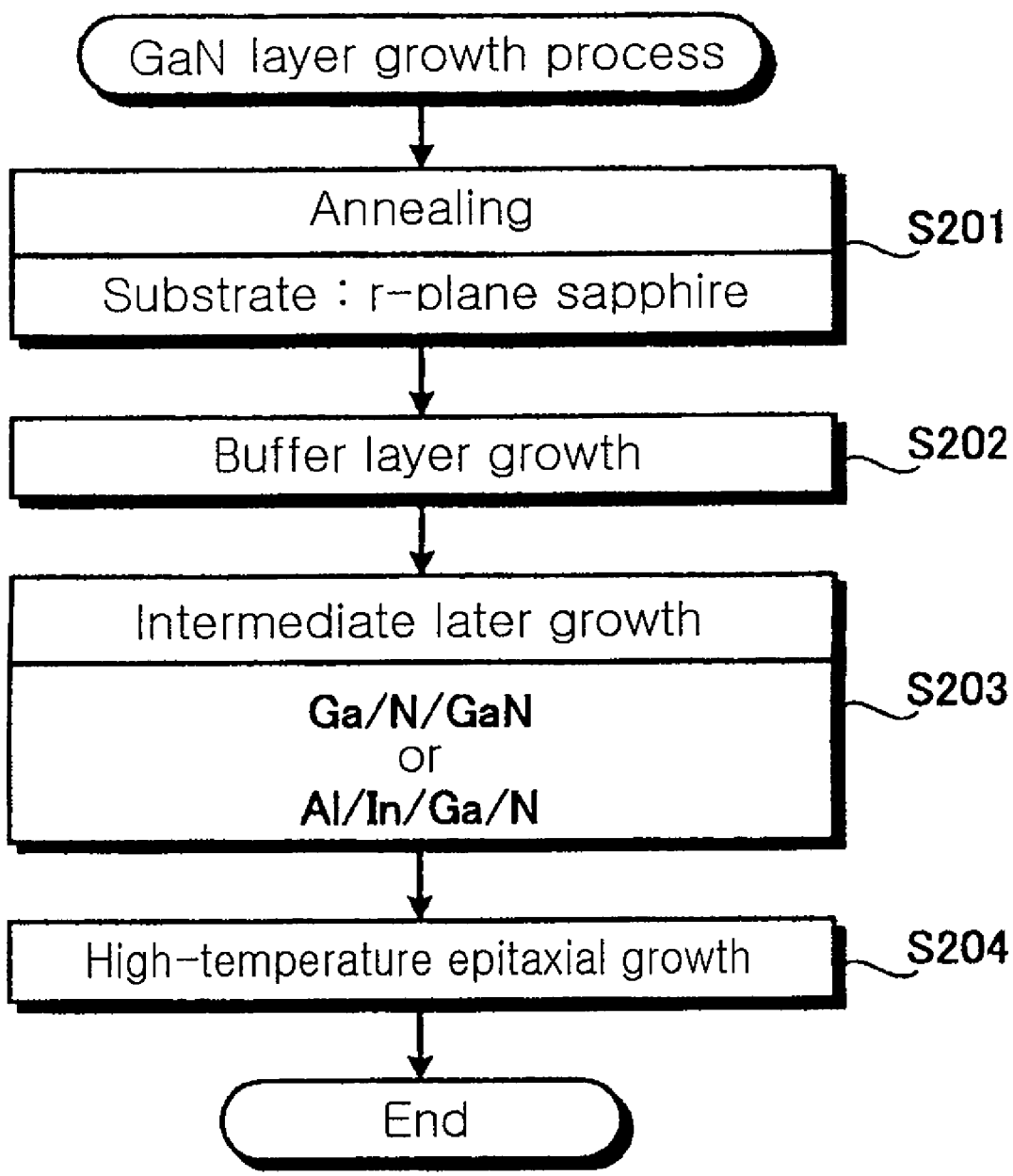
FIG. 9 is a flow chart illustrating a process for forming the group III-nitride semiconductor thin film according to the second embodiment of the present invention.

The group III-nitride semiconductor thin film 200 was obtained by the following fabrication method, which was developed by the inventors of the present invention. The inventors of the present invention proved that the best result is obtained, in particular, when the intermediate layer 230 is formed by stacking the multiple Ga/N/GaN layers so as to form a so-called Ga/N/GaN multilayer, or formed by stacking the multiple Al/In/Ga/N layers so as to form a so-called Al/In/Ga/N multilayer. FIG. 9 is a flow chart illustrating the fabrication method, more particularly, a process for forming the GaN thin film.

First, the r-plane sapphire substrate 210 was washed and was subjected to an annealing process within the reaction chamber of the MOCVD apparatus, for example, in the same manner as that of the first embodiment (Step S201).

Subsequently, the low-temperature buffer layer 220 was grown on the r-plane sapphire substrate 210 (Step S202). Specifically, the low-temperature buffer layer 220 was grown under atmospheric pressure by use of a well known method suitable to obtain a low-temperature buffer layer interposed between a GaN-based compound and a c-plane sapphire substrate. For example, the low-temperature buffer layer 220 was made of GaN or AlN.

Then, the intermediate layer 230, namely, Ga/N/GaN multilayer or Al/In/Ga/N multilayer, was grown on the low-temperature buffer layer 220 (Step S203). A method for forming the multilayer will be explained later.

Thereafter, the undoped GaN layer 240, which is a high-temperature epilayer, was grown on the intermediate layer 230 (Step S204). The GaN layer 240, for example, may be grown under the same growth conditions as the GaN layer 130 of the first embodiment.

Now, the method for forming the Ga/N/GaN multilayer will be explained. The Ga/N/GaN multilayer was formed by use of a pulsed atomic layer epitaxy (PALE) method. In this PALE method, a plurality of different materials are sequentially introduced into the reaction chamber of the MOCVD apparatus in response to predetermined pulse signals. The Ga/N/GaN multilayer is made of ammonia ($NH_3$) and trimethylgallium (TMG).

Figure 10:
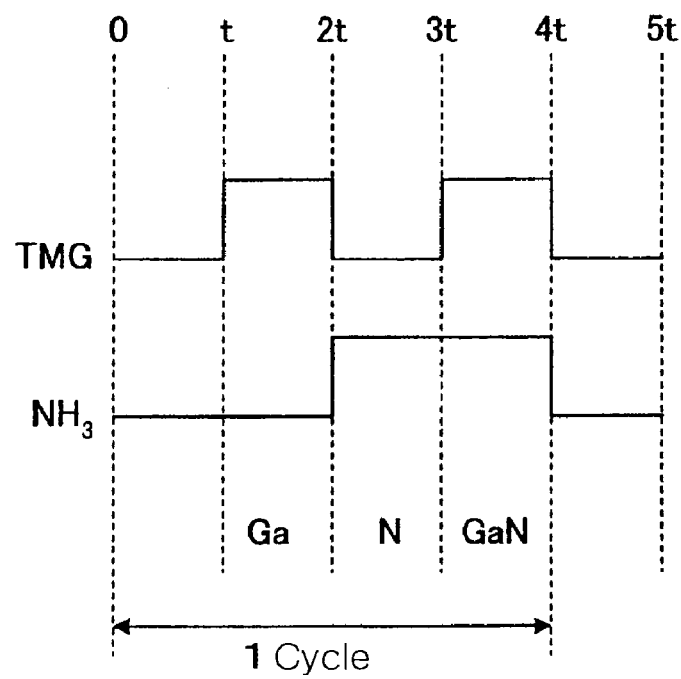
FIG. 10 is a timing chart of a pulsed atomic layer epitaxy method for growing a Ga/N/GaN multilayer.

FIG. 10 is a timing chart of the pulsed atomic layer epitaxy method for growing the Ga/N/GaN multilayer. In FIG. 10, four clocks make up one cycle, and one clock period is it. Specifically, no TMG and $NH_3$ are introduced for a first clock (0 to 1$t$), only TMG is introduced for a second clock (1$t$ to 2$t$), and only $NH_3$ is introduced for a third clock (2$t$ to 3$t$). Here, it should be noted, in particular, that $NH_3$ is introduced next to organic metal TMG. Thereafter, both TMG and $NH_3$ are introduced for a fourth clock (3$t$ to 4$t$). In other words, Ga is first grown on the low-temperature GaN buffer layer 220, and then, N is grown thereon, and finally, GaN is grown thereon. In this way, the Ga/N/GaN layer is formed on the low-temperature GaN buffer layer 220 after completion of one cycle.

The intermediate layer 230 of the Ga/N/GaN multilayer is obtained by repeatedly performing the above described Ga/N/GaN layer forming cycle. It was known that it is preferable to perform 2 to 100 cycles, and more preferably, to perform 10 to 20 cycles in order to obtain the best result. Furthermore, the best result may be obtained when one clock period (t) is preferably in a range from 1 to 60 seconds, and more preferably, in a range from 2 to 10 seconds. Preferably, the temperature of the substrate is controlled within a range from 850 degrees Celsius to 1100 degrees Celsius.

Figure 11B:
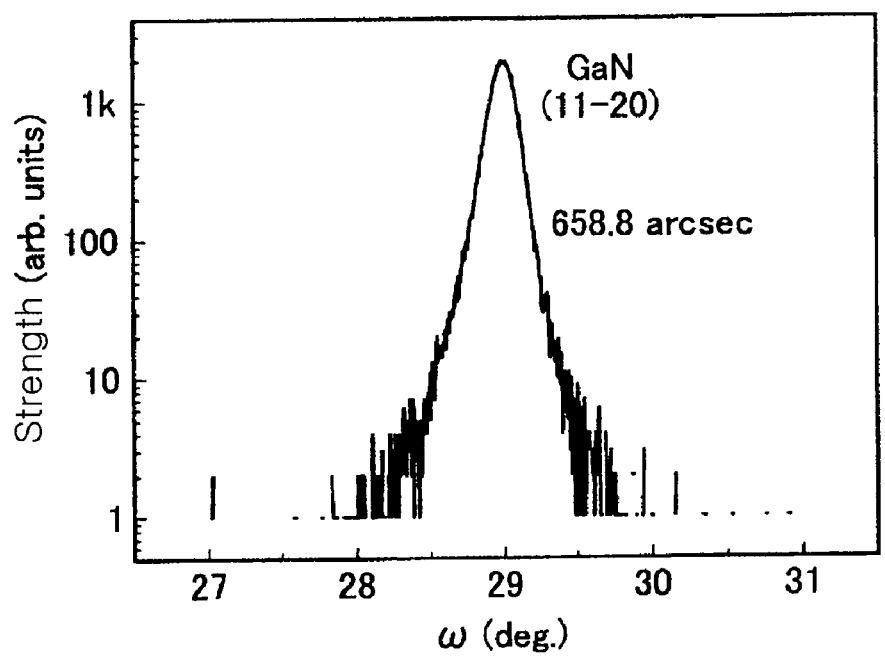
FIG. 11B is a graph illustrating X-ray diffraction evaluation data of the sample GaN layer shown in FIG. 11A.
Figure 11A:
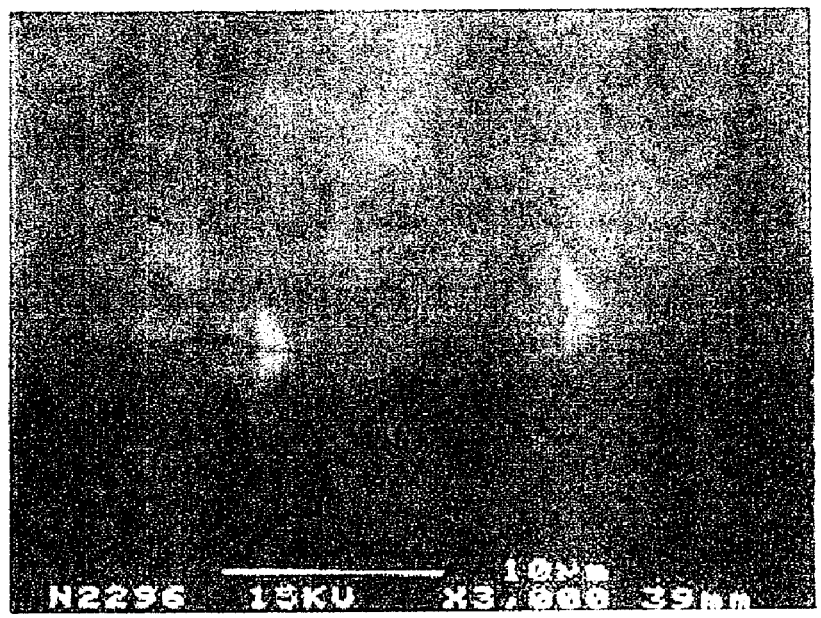
FIG. 11A is a SEM photograph illustrating a surface of a GaN layer, which is grown on an intermediate layer composed of a Ga/N/GaN multilayer.

FIG. 11A is a SEM photograph illustrating a surface of the GaN layer 240, which is formed on the intermediate layer 230 of the Ga/N/GaN multilayer. In this sample, the Ga/N/GaN multilayer was grown by repeating the above described Ga/N/GaN layer forming cycle ten times (one clock period (t) of each cycle is 4 seconds). It could be confirmed from the SEM photograph shown in FIG. 11A that substantially no morphology was generated in the GaN layer 240.

Figure 12A:
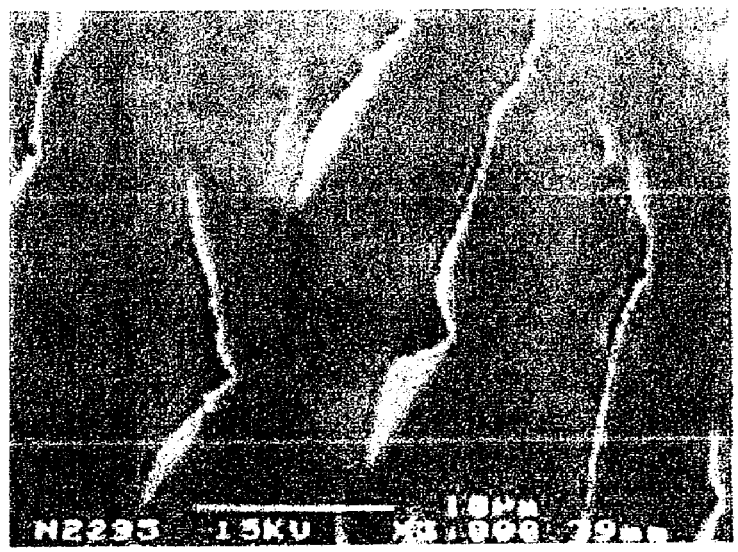
FIG. 12A is a SEM photograph illustrating a surface of a high-temperature GaN layer, which is grown on a low-temperature buffer layer.
Figure 12B:
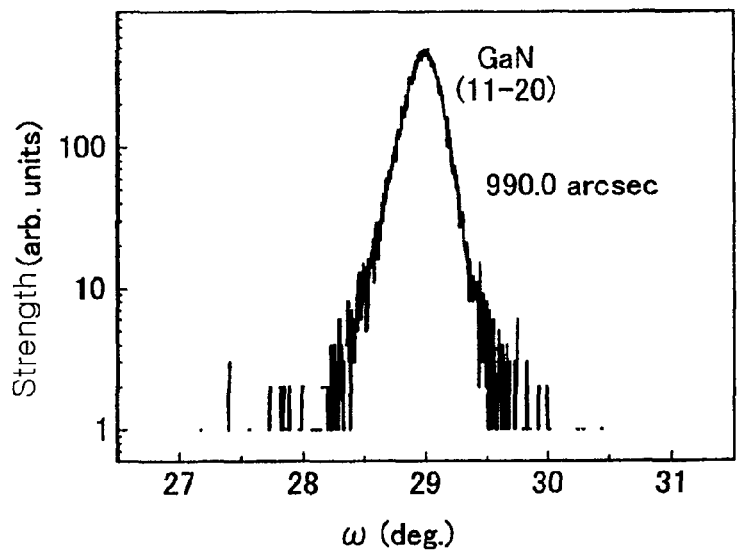
FIG. 12B is a graph illustrating X-ray diffraction evaluation data of the sample GaN layer shown in FIG. 12A.

FIG. 11B is a graph illustrating X-ray diffraction evaluation data of the sample GaN layer 240 shown in FIG. 11A. As shown in FIG. 11B, the GaN layer 240 has a full width at half maximum of 658.8 arcsec. To evaluate X-ray diffraction result and the SEM photograph, the inventors of the present invention performed a comparative experiment. FIG. 12A is a SEM photograph illustrating a surface of the GaN layer when the high-temperature GaN layer is grown on the low-temperature buffer layer without interposing the intermediate layer 230 therebetween, and FIG. 12B is a graph illustrating X-ray diffraction evaluation data of the sample GaN layer. It could be seen from the SEM photograph shown in FIG. 12A that large-scale morphologies representing electric potential defects were generated at the surface of the GaN layer, and the full width at half maximum of the GaN layer was 990.0 arcsec as shown in FIG. 12B.

As could be confirmed by comparing FIG. 11A with FIG. 12A and FIG. 11B with FIG. 12B, the GaN layer 240 can achieve an improved quality when the intermediate layer 230 of the Ga/N/GaN multilayer is interposed between the low-temperature buffer layer 220 and the GaN layer 240.

Next, a method for forming the Al/In/Ga/N multilayer will be explained. The Al/In/Ga/N multilayer is also formed by the pulsed atomic layer epitaxy method. The Al/In/Ga/N multilayer is made of trimethylaluminum (TMA), trimethylindium (TMA), trimethylgallium (TMG) and ammonia ($NH_3$).

Figure 13:
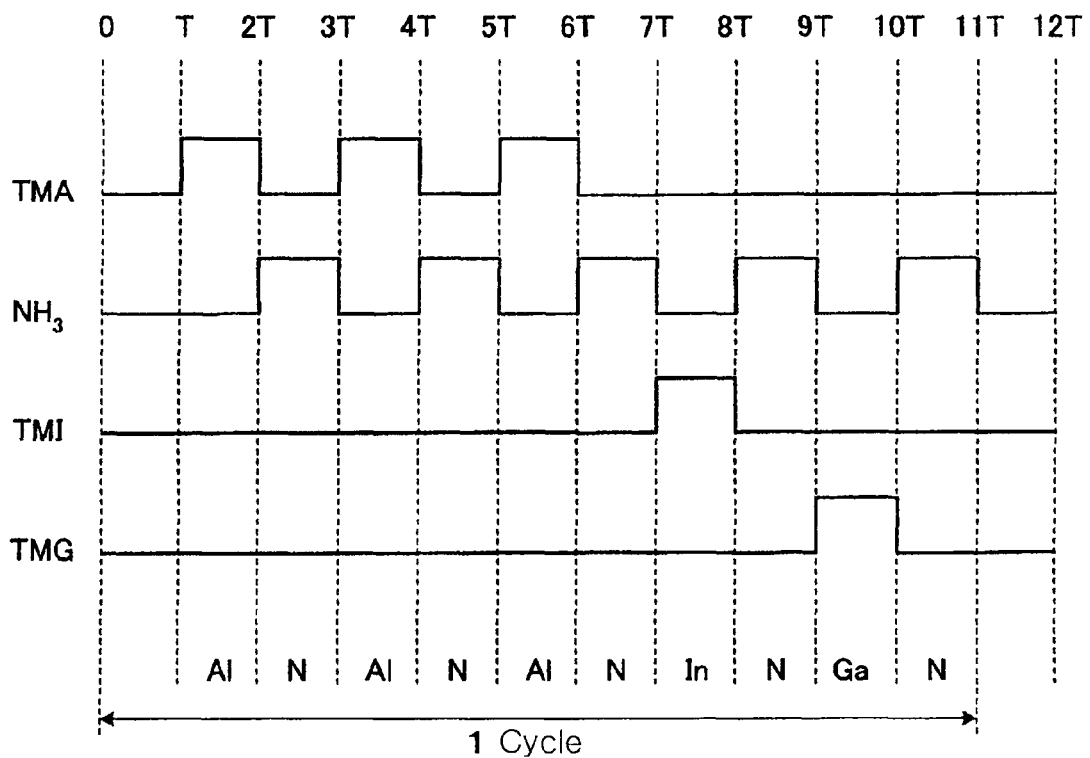
FIG. 13 is a timing chart of a pulsed atomic layer epitaxy method for growing an Al/In/Ga/N multilayer.

FIG. 13 is a timing chart of the pulsed atomic layer epitaxy method for growing the Al/In/Ga/N multilayer. As shown in FIG. 13, eleven clocks make up one cycle, and one clock period is 1T. Specifically, no material is introduced for a first clock (0 to 1T), only TMA is introduced for a second clock (1T to 2T), and only $NH_3$ is introduced for a third clock (2T to 3T). Similarly, TMA, $NH_3$, TMA and $NH_3$ are introduced in this sequence for a fourth clock (3T to 4T), a fifth clock (4T to 5T), a sixth clock (5T to 6T), and a seventh clock (6T to 7T), respectively. Subsequently, only TMI is introduced for an eighth clock (7T to 8T), only $NH_3$ is introduced for a ninth clock (8T to 9T), only TMG is introduced for a tenth clock (9T to 10T) and only $NH_3$ is introduced for an eleventh clock (10T to 11T). Here, it should be noted, in particular, that $NH_3$ is introduced next to the respective organic metals TMA, TMI and TMG. As a result of controlling the introduction of the material gas as stated above, Al, N, Al, N, Al, N, In, N, Ga and N are grown on the low-temperature GaN layer 220 in this sequence. In this way, the AlN/InN/GaN layer is formed on the low-temperature GaN layer 220 after completion of one cycle. Although InN evaporates if the temperature of the substrate rises beyond 950 degrees Celsius, the inventors of the present invention confirmed that an InN grown multilayer can obtain better results than a multilayer having no InN.

The intermediate layer 230 of the Al/In/Ga/N multilayer is obtained by repeatedly performing the above described Al/In/Ga/N layer forming cycle. Similarly, it is preferable to perform 2 to 100 cycles, and more preferably, to perform 10 to 20 cycles in order to obtain the best result. Also, the best result may be obtained when one clock period (t) is preferably in a range from 1 to 60 seconds, and more preferably, in a range from 2 to 10 seconds. Preferably, the temperature of the substrate is controlled within a range from 850 degrees Celsius to 1100 degrees Celsius.

Figure 14A:
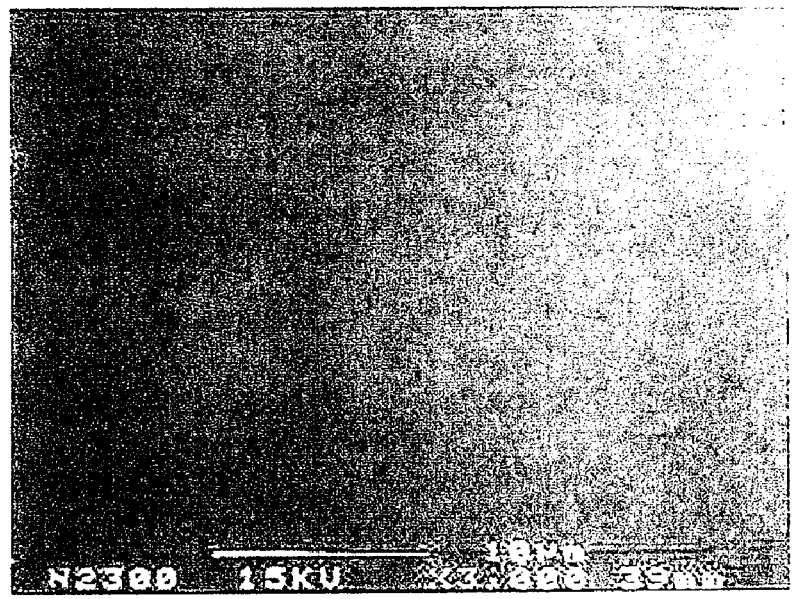
FIG. 14A is a SEM photograph illustrating a surface of a GaN layer, which is grown on an intermediate layer composed of an Al/In/Ga/N multilayer.

FIG. 14A is a SEM photograph illustrating a surface of the GaN layer 240, which is formed on the intermediate layer 230 of the Al/In/Ga/N multilayer. In this sample, the Al/In/Ga/N multilayer was grown by repeating the above described Al/In/Ga/N layer forming cycle fifteen times (one clock period (T) is 4 seconds). It could be seen from the SEM photograph shown in FIG. 14A that substantially no morphology was generated at the surface of the GaN layer.

Figure 14B:
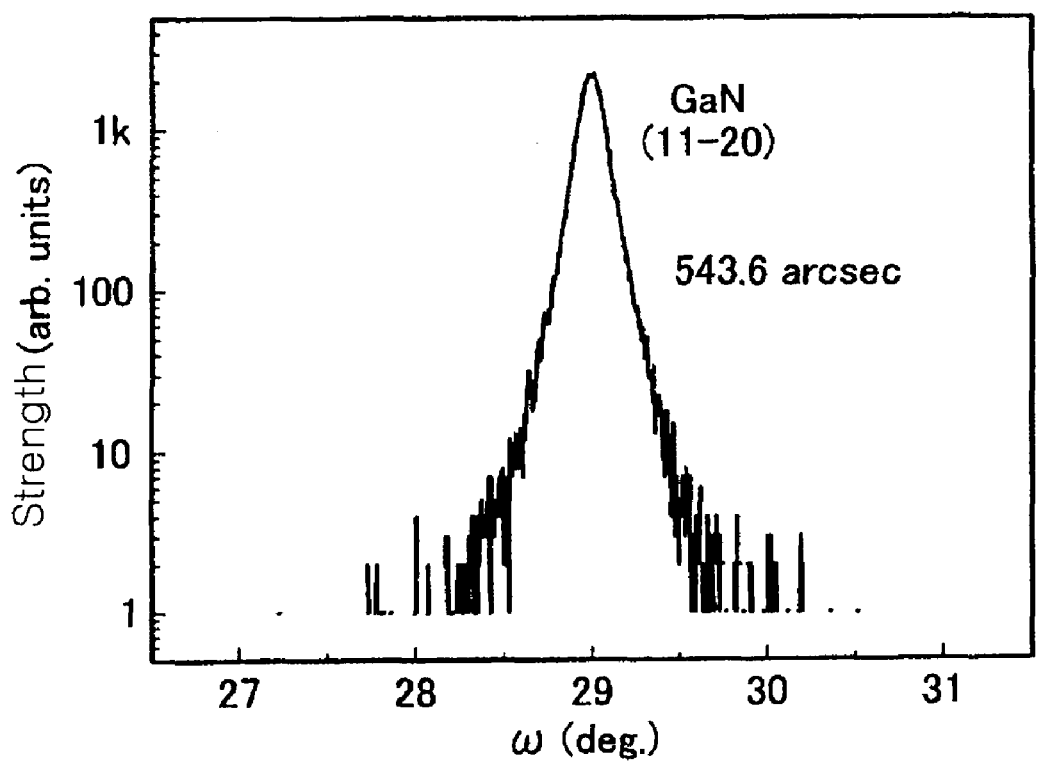
FIG. 14B is a graph illustrating X-ray diffraction evaluation data of the sample GaN layer shown in FIG. 14A.

FIG. 14B is a graph illustrating X-ray diffraction evaluation data of the sample GaN layer 240 shown in FIG. 14A. As shown in FIG. 14B, the GaN layer 240 has a full width at half maximum of 543.6 arcsec. It could be confirmed by comparing FIGS. 14A and 14B with FIGS. 12A and 12B that the GaN layer 240 can achieve an improved quality when the intermediate layer 230 of the Al/In/Ga/N multilayer is interposed between the low-temperature buffer layer 220 and the GaN layer 240.

In the above described group III-nitride semiconductor thin film 200, the low-temperature buffer layer 220, on which the intermediate layer 230 is grown by a conventional growth method, may be replaced by the AlInN buffer layer 120 of the first embodiment. Alternatively, the intermediate layer 230 may be directly formed on the r-plane sapphire substrate 210 without forming the low-temperature buffer layer 220 therebetween. In this case, the intermediate layer 230, which is made of the Ga/N/GaN multilayer or Al/In/Ga/N multilayer, may function as a buffer layer.

Figure 15:
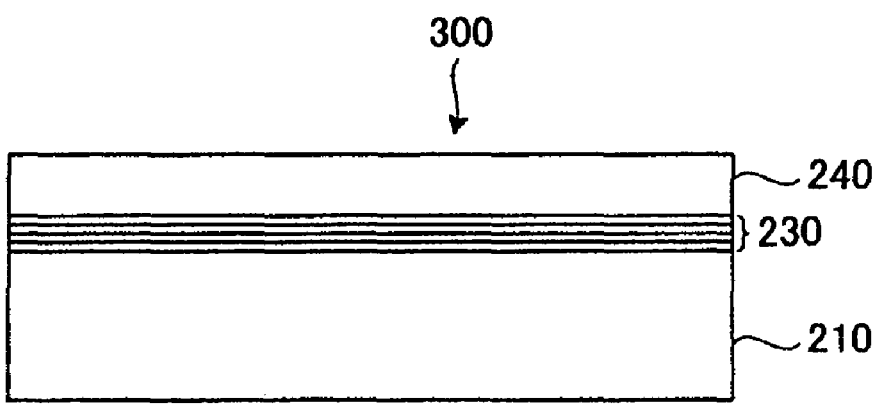
FIG. 15 is a schematic side sectional view illustrating a group III-nitride semiconductor thin film, which includes an intermediate layer serving as a buffer layer.

FIG. 15 is a schematic side sectional view illustrating a group III-nitride semiconductor thin film in which the intermediate layer 230 functions as a buffer layer. In FIG. 15, the same parts as those of FIG. 7 will be designated as the same reference numerals, and the description thereof will be omitted. As shown in FIG. 15, in the group III-nitride semiconductor thin film 300, the intermediate layer 230 forms a buffer layer between the r-plane sapphire substrate 210 and the undoped GaN layer 240.

Figure 16A:
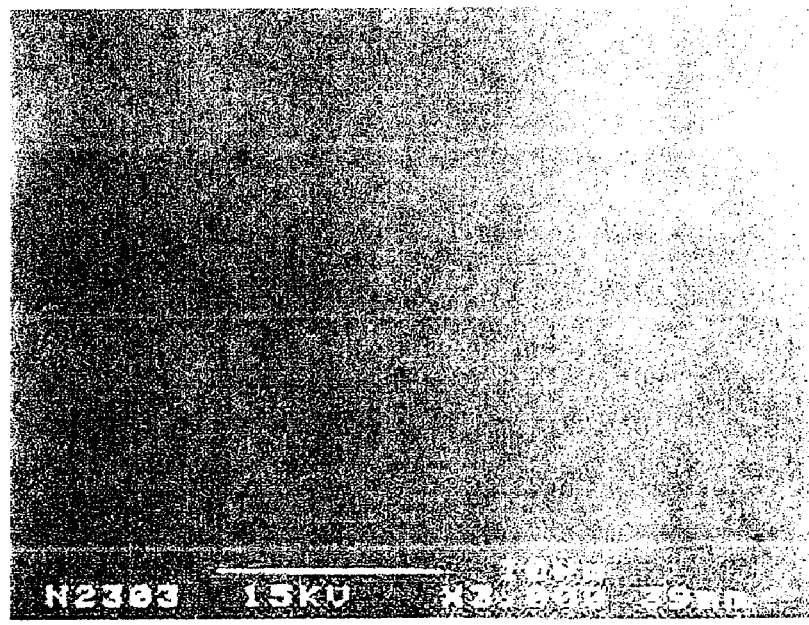
FIG. 16A is a SEM photograph illustrating a surface of a GaN layer, which is grown on an intermediate buffer layer composed of an Al/In/Ga/N multilayer.

FIG. 16A is a SEM photograph illustrating a surface of the GaN layer 240 on the intermediate layer 230, which is made of the Al/In/Ga/N multilayer and functions as a buffer layer. In this sample, the temperature of the substrate was controlled to 950 degrees Celsius, and the Al/In/Ga/N multilayer was grown by repeating the above described Al/In/Ga/N layer forming cycle twenty times (one clock period (T) of each cycle is 4 seconds), on the basis of the timing chart of FIG. 13 and the same growth conditions as those of the sample shown in FIG. 12A. Although morphologies representing electric potential defects can be confirmed from the SEM photograph shown in FIG. 16A, the number and size of the morphologies are negligible as compared to those of the SEM photograph shown in FIG. 12A.

Figure 16B:
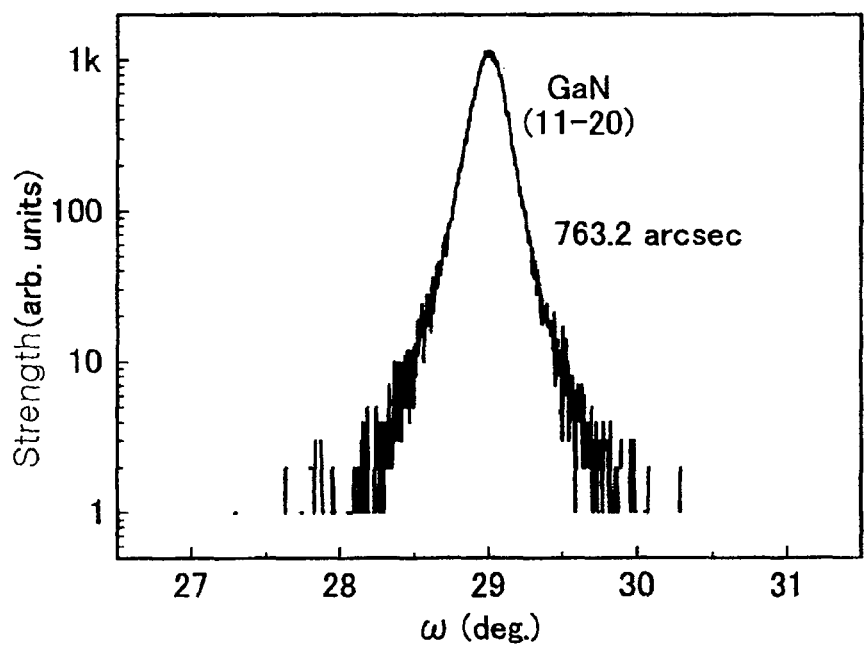
FIG. 16B is a graph illustrating X-ray diffraction evaluation data of the sample GaN layer shown in FIG. 16A.

FIG. 16B is a graph illustrating X-ray diffraction evaluation data of the sample GaN layer 240 shown in FIG. 16A. As shown in FIG. 16B, the GaN layer 240 has a full width at half maximum of 763.2 arcsec. This value is smaller than the full width at half maximum of 990.0 arcsec shown in FIG. 12B. As can be seen from the result, the GaN layer 240 can achieve an improved quality when the intermediate layer 230 of the Al/In/Ga/N multilayer is interposed as a buffer layer between the r-plane sapphire substrate 210 and the GaN layer 240.

As described above, according to the second embodiment, by forming an intermediate layer, which is obtained by a pulsed atomic layer epitaxy method, on a low-temperature buffer layer formed on an r-plane sapphire substrate, or growing the intermediate layer, which is obtained by a pulsed atomic layer epitaxy method and serves as a buffer layer, on the r-plane sapphire substrate, a high-quality GaN layer can be grown thereon. Similar to the group III-nitride semiconductor thin film according to the first embodiment, the GaN layer is also formed along an a-axis on the r-plane oriented sapphire substrate, and therefore, has no polarization in a thickness direction thereof, which is disadvantageously caused when using a c-plane sapphire substrate. That is, the group III-nitride semiconductor thin film of the second embodiment can achieve the same effects as those of the first embodiment.

Although the above description exemplifies the intermediate layer of the Ga/N/GaN multilayer or Al/In/Ga/N multilayer, the intermediate layer may have other combinations of nitrogen and organic metals. For example, it could be confirmed that, even when Al/N/AlN multilayer, Al/N/GaN multilayer, Ga/N/AlN multilayer, In/N/InN multilayer, or the like is employed as the intermediate layer, the quality of the high-temperature GaN layer grown thereon can be improved as compared to the case having no intermediate layer.

Also, although GaN was employed to form the high-temperature epilayer in the above described first and second embodiments, it can be understood that a high-quality thin film can be obtained even when GaN is replaced by other GaN-based compounds, such as AlGaN, etc.

Third Embodiment

The group III-nitride semiconductor thin films according to the above described first and second embodiments may be utilized as a base layer that constitutes a group III-nitride semiconductor light emitting device (LED), etc. In the third embodiment of the present invention, an example of applying the group III-nitride semiconductor thin film of the first embodiment to an LED will be explained.

Figure 17:
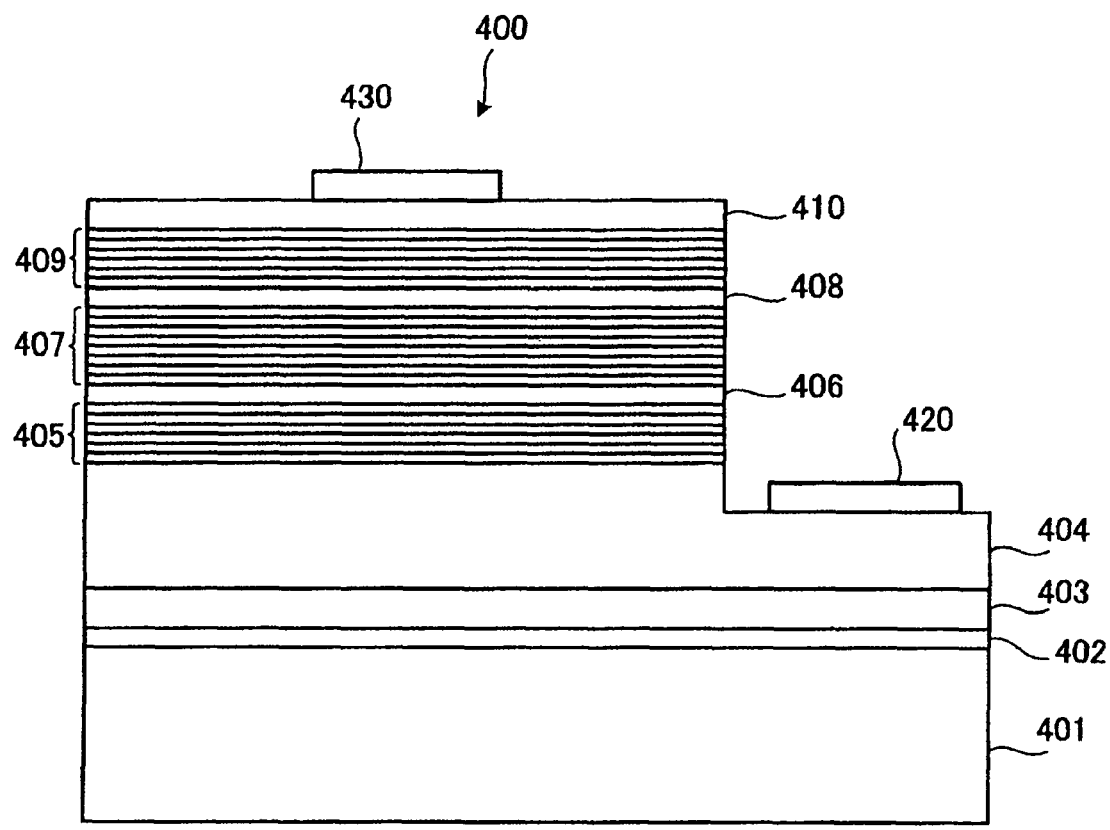
FIG. 17 is a schematic side sectional view illustrating a group III-nitride semiconductor light emitting device according to a third embodiment of the present invention.

FIG. 17 is a schematic side sectional view illustrating a group III-nitride semiconductor light emitting device (LED) according to the third embodiment of the present invention. As shown in FIG. 17, the group III-nitride semiconductor light emitting device, which is designated as reference numeral 400, includes an r-plane sapphire substrate 401, AlInN buffer layer 402, undoped GaN layer 403, n-type contact layer 404, n-type cladding layer 405, n-type intermediate layer 406, active layer 407, p-type block layer 408, p-type cladding layer 409 and p-type contact layer 410, which are stacked in this sequence.

Here, the r-plane sapphire substrate 401, AlInN buffer layer 402 and undoped GaN layer 403 constitute a thin film corresponding to the group III-nitride semiconductor thin film 100 of the previously described first embodiment.

The n-type contact layer 404, for example, is grown by injecting Si into GaN, and the n-type cladding layer 405, for example, has a super lattice structure obtained by injecting Si into (AlGaN/GaN)$^n$ (here, the constant "n" is 50). The n-type intermediate layer 406, for example, is grown by dopping Si into AlGaN, and the active layer 407, for example, has a multiple quantum well structure of (AlInGaN/InGaN)$^n$ (here, the constant "n" is 5). The p-type block layer 408, for example, is grown by injecting Mg into AlGaN, and the p-type cladding layer 409, for example, has a super lattice structure obtained by injecting Mg into (AlGaN/GaN)$^n$ (here, the constant "n" is 50). The p-type contact layer 401, for example, is grown by injecting Mg into GaN.

Each of the n-type contact layer 404, n-type cladding layer 405, n-type intermediate layer 406, active layer 407, p-type block layer 408, p-type cladding layer 409, and p-type contact layer 410 is partially removed, at their corresponding regions, by etching, so as to expose a portion of the n-type contact layer 404. An n-type electrode 420 is provided on the exposed portion of the n-type contact layer 404, and a p-type electrode 43 is provided on the p-type contact layer 410. With this configuration, for example, an LED having a light emitting peak wavelength of 380 nm can be realized.

In particular, since the group III-nitride semiconductor light emitting device 400 employs the group III-nitride semiconductor thin film 100 of the previously described first embodiment as a base layer, the active layer 407, n-type cladding layer 405 and p-type cladding layer 409, which have a multiple quantum well structure and super lattice structure and require the control of thickness with high accuracy, can be formed to realize an increase in the allowable thickness range of each layer constituting a pair. The increased allowable thickness range enables an improvement in the yield of the group III-nitride semiconductor light emitting device 400 satisfying essential requirements.

In conclusion, the group III-nitride semiconductor thin film according to the present invention is useful as a base layer for growing GaN-based compounds thereon, and in particular, is appropriate as a constituent element of a group III-nitride semiconductor light emitting device.

As apparent from the above description, the present invention provides a group III-nitride semiconductor thin film and group III-nitride semiconductor light emitting device, which has the effects of achieving an improvement in the yield of products, eliminating a necessity of high accuracy control, and enabling an economical production using low-cost equipment.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a group III-nitride semiconductor thin film comprising:
    forming an intermediate layer on a (1-102)-plane sapphire substrate by stacking two or more group III-nitride layers one above another, each group III-nitride layer formed by nitriding a group III-metal atomic layer; and
    growing a group III-nitride epitaxial layer on the intermediate layer,
    wherein the group III-nitride layers include sequentially stacked first and second group III-nitride layers, the group III-metal atomic layers of which are made of different metals selected from the group consisting of Ga, Al, and In.

2. The method according to claim 1, further comprising forming an AlInN buffer layer on a (1-102)-plane sapphire substrate to a first temperature before forming an intermediate layer, wherein the step of forming an intermediate layer comprises forming an intermediate layer on the buffer layer while controlling the sapphire substrate to a second temperature higher than the first temperature.

3. The method according to claim 2, wherein the first temperature is in a range from 850 degrees Celsius to 950 degrees Celsius.

4. The method according to claim 2, wherein the formation of the buffer layer and the growth of the group III-nitride epitaxial layer are performed at atmospheric pressure.

5. The method according to claim 1, wherein the group III-nitride epitaxial layer is made of GaN.

6. The method according to claim 1, wherein the group III-nitride epitaxial layer is made of AlGaN.

7. The method according to claim 1, wherein the group III-nitride layers further include a third group III-nitride layer and the group III-metal atomic layer of the third group III-nitride layer is made of different metal from the first and second multi-level layers.

* * * * *